(12) United States Patent
Reyes et al.

(10) Patent No.: US 6,787,901 B2
(45) Date of Patent: Sep. 7, 2004

(54) STACKED DIES UTILIZING CROSS CONNECTION BONDING WIRE

(75) Inventors: Edward Reyes, San Marcos, CA (US); Fifin Irzhann, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 150 days.

(21) Appl. No.: 10/282,795

(22) Filed: Oct. 28, 2002

(65) Prior Publication Data

US 2003/0102569 A1 Jun. 5, 2003

Related U.S. Application Data

(62) Division of application No. 09/932,160, filed on Aug. 17, 2001, now abandoned.

(51) Int. Cl.[7] .............................. H01L 23/34; H05K 7/10
(52) U.S. Cl. ...................... 257/724; 257/735; 257/776; 257/777; 257/784; 257/786; 361/767; 361/772; 361/774; 361/778
(58) Field of Search ................................. 361/600, 679, 361/748, 749, 760, 767, 772–778; 29/841, 855, 856; 438/22, 26, 33, 48, 50, 51, 106–109, 118, 119, 125–127, 584, 597, 612–617, 342, 344, 365, 368; 257/664, 678, 685–687, 690–692, 723, 724, 734, 735, 773, 776, 777, 782–784, 786, 787; 228/101, 178, 179.1, 180.5; 174/52.1–52.4, 68.1, 250, 251, 261, 50

(56) References Cited

U.S. PATENT DOCUMENTS

| | | | | |
|---|---|---|---|---|
| 5,323,060 A | * | 6/1994 | Fogal et al. ................. | 257/777 |
| 5,422,435 A | * | 6/1995 | Takiar et al. ............... | 174/52.4 |
| 5,552,966 A | * | 9/1996 | Nagano ....................... | 361/813 |
| 5,670,824 A | * | 9/1997 | Weinberg .................... | 257/723 |
| 5,723,906 A | * | 3/1998 | Rush ........................... | 257/723 |
| 6,014,586 A | * | 1/2000 | Weinberg et al. ............ | 607/36 |
| 6,252,305 B1 | | 6/2001 | Lin et al. | |
| 6,407,456 B1 | * | 6/2002 | Ball ........................... | 257/777 |
| 6,431,456 B2 | * | 8/2002 | Nishizawa et al. ......... | 235/492 |
| 6,472,747 B2 | * | 10/2002 | Bazarjani et al. ........... | 257/724 |
| 6,476,506 B1 | * | 11/2002 | O'Connor et al. .......... | 257/786 |
| 6,208,018 B1 | | 3/2003 | Ma et al. | |
| 2003/0042621 A1 | * | 3/2003 | Chen et al. ................. | 257/784 |

FOREIGN PATENT DOCUMENTS

| | | | | | |
|---|---|---|---|---|---|
| JP | 59143354 A | * | 8/1984 | ........... | H01L/23/48 |
| JP | 2001189415 A | * | 7/2001 | ......... | H01L/25/065 |
| WO | 0150525 | | 11/2000 | | |

* cited by examiner

Primary Examiner—Alonzo Chambliss
(74) Attorney, Agent, or Firm—Philip R Wadsworth; Charles D Brown; George C. Pappas

(57) ABSTRACT

An integrated circuit package is constructed by attaching lower dies to a substrate that has bond fingers deposited on its surface. One lower die and its associated bond fingers are located offset from the center of the substrate. The lower dies are electrically coupled to the substrate's bond fingers with lower bond wires. An upper die is stacked on at least one of the lower dies. The upper die is electrically coupled, with bond wires, to the lower die upon which it is mechanically coupled. Each of the lower dies may be coupled to the other lower die with bond wire bridges that span the lower bond wires. The upper die may be electrically coupled, with bond wire bridges, to any or all of the lower dies.

7 Claims, 6 Drawing Sheets

STACKED DIES UTILIZING CROSS CONNECTION BONDING WIRE

CROSS-REFERENCE TO RELATED APPLICATIONS

This following application of common assignee contains some common disclosure as the following application. U.S. Patent Application entitled "Mixed Analog and Digital Integrated Circuits", filed Mar. 2, 2001 and assigned application Ser. No. 09/798,198, issuing as U.S. Pat. No. 6,472,747 on Oct. 29, 2002 in the name of QUALCOMM Incorporated. Furthermore, this application is a Divisional of U.S. patent application Ser. No. 09/932,160, filed on Aug. 17, 2001 now abandoned, and assigned to the assignee of the present application.

BACKGROUND OF THE INVENTION

1. Field of the Invention

The present invention relates generally to integrated circuits. Particularly, the present invention relates to the stacking of dies on an integrated circuit substrate.

2. Description of the Related Art

Integration at the silicon level can be expensive. Typically, the number of transistors on a die can be increased by decreasing the size of the transistors. However, manufacturing an integrated circuit (IC) package that must be comprised of different types of circuits (e.g., analog, digital) can pose various problems.

For example, a problem might be that one circuit is manufactured with 0.25 µm technology while another circuit is manufactured with 0.18 µm technology. The integrated circuit designer must either manufacture two separate integrated circuits or try to design the 0.25 µm technology circuit using the 0.18 µm technology. Neither solution is acceptable since the first increases the size and cost of an electronic product manufactured with multiple integrated circuit packages while the second solution requires additional time and cost to design the new circuit.

An additional problem with combining circuits is the cost associated with designing the different circuits on one die. This requires redesigning the die and designing additional processes to manufacture the die.

One solution for combining circuits in an IC-package is to stack separate dies comprising different technologies. Such a die stacking process would be limited to one die on top of another due to the requirement of electrically coupling the dies to bond fingers on the substrate. Dies and substrates are currently manufactured with their pads and bond fingers on their respective peripheries such that bonding wires from the pads to the bonding fingers surround the die on most sides.

Another difficulty in die stacking is electrically coupling the circuit of the upper die to the circuit of the lower die without going to the substrate first. This would require additional bond fingers on an already densely laid-out substrate. There is a resulting need for a more efficient and less expensive method for increasing the circuit density of an IC-package by die stacking.

SUMMARY OF THE INVENTION

The die-stacking method and integrated circuit (IC) package apparatus of the present invention enable an IC-package to be manufactured that comprises multiple circuit technologies. The die-stacking method integrates at the IC-package level by the stacking and coupling of multiple dies to produce an integrated circuit apparatus that is the same size as a non-stacked integrated circuit but has greater functionality.

The IC package of the present invention is possible by grouping the bond fingers in a location of the substrate that is offset from the center of the substrate. This permits additional dies to be added to the substrate laterally from a first die that is positioned in the offset location.

The lateral dies and the stacked dies each have their pads grouped in a predetermined area that corresponds with specially grouped pads on the first die. The dies that are positioned laterally from the first die are coupled directly to the first die with bond wire bridges that span lower bond wires. The stacked dies are electrically coupled to the first die with bond wires to a group of the specially grouped pads.

The method for constructing an integrated circuit apparatus comprises generating a substrate with a plurality of bond fingers. A lower die is coupled to the substrate. This coupling comprises both mechanically attaching the die to the substrate and electrically coupling the die circuitry to the bond fingers with bond wires.

An upper die is mechanically attached to the lower die. The upper die is then electrically coupled to the substrate such that pads on the upper die are coupled to the plurality of bond fingers. The upper die may be electrically coupled to the lower die with additional bond wires If a second lower die is attached to the substrate, a bridge of bond wires electrically couples the upper die to the second lower die. A bond wire bridge may also electrically couple the second lower die to the first lower die.

DETAILED DESCRIPTION OF THE PREFERRED EMBODIMENT

The present invention enables the design of integrated circuits, which comprise various technologies, by stacking the dies. The stacked dies are then coupled to the substrate using die-to-substrate wire bonds and to each other with either die-to-die wire bonds or die-to-die wire bridges that span any lower wire bonds.

Figure 1:
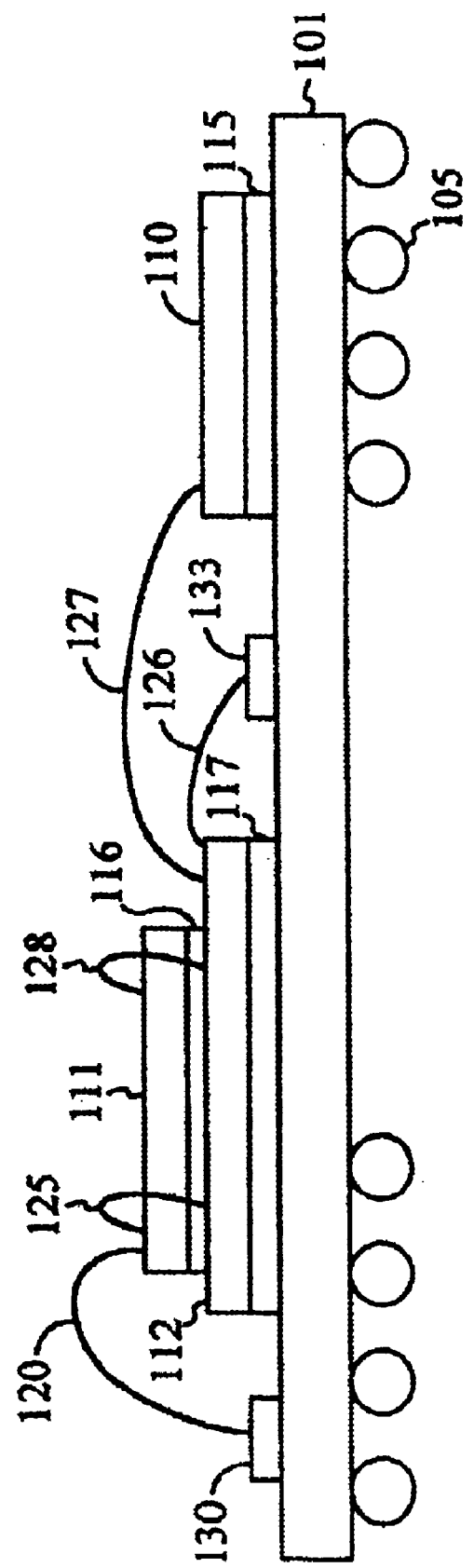
FIG. 1 shows a cut-away side view of one embodiment of an integrated circuit apparatus employing the die-stacking method of the present invention.

FIG. 1 illustrates a cut-away side view of an integrated circuit apparatus of the present invention. This apparatus is comprised of a substrate (101) having a circuit pattern of traces, vias (i.e., plated through holes that couple different layers of traces in the substrate), and bond fingers. The circuit pattern is etched into a metal layer on the substrate using processes that are well known in the art. In one embodiment, the substrate (101) is comprised of BT-Resin material. Alternate embodiments use other materials for the substrate as is well known in the art.

The substrate (101) is attached to a circuit board using the solder balls (105) that are coupled to the underside of the substrate (101). These solder balls (105) are coupled to the input/output pads of the substrate traces. When an integrated circuit package comprising the substrate is to be mounted to a circuit board, the solder balls (105) are heated to their melting point such that they adhere to corresponding pads on the circuit board. This mounting process is well known in the art and is not discussed further.

The lower dies (110 and 112) of the present invention are mechanically coupled to the substrate (101) using layers of a die attach epoxy (115 and 117). This epoxy (115 and 117) solidly attaches the dies (110 and 112) to the substrate (101). Similarly, the die (111) that is stacked on top of a lower die (112) is attached to that die using a similar epoxy (116). This epoxy (116) also provides an electrical isolation between the upper and lower dies.

The lower dies (110 and 112) are electrically coupled to the substrate bond fingers with bond wires (126). A bond wire (126) couples a pad on the die (112) with a bond finger (133).

Similarly, the stacked die (111) is comprised of pads that are electrically coupled to pads on the lower die (112) through bond wires (125 and 128). Some of the pads on the stacked die (111) may also be coupled to bond fingers (130) on the substrate (101) through a bond wire (120).

Additionally, the dies may be coupled to each other through a bond wire bridge (127). The bond wire bridge (127) couples one die (112) to another die (110) while spanning lower bond wires (126) that are coupled to the substrate (101). While FIG. 1 illustrates the bond wire bridge as going from one lower die (112) to another lower die (110), the bond wire bridge can be accomplished in many different embodiments. Any embodiment where a die needs to be electrically coupled to another die or to the substrate over lower bond wires would require a bond wire bridge. For example, a bond wire bridge may also connect the stacked die (111) to the second lower die (110) while spanning the lower bond wires of the first die (112).

In the preferred embodiment, the dies that are electrically coupled to the substrate are a digital mobile station modem (112) and flash memory (110). The die (111) that is stacked on the mobile station modem (112) is an analog circuit with memory. Alternate embodiments use dies with other functionalities.

In the interest of clarity, not all of the required bond wires are shown in FIG. 1. It is well known in the art that hundreds of bond wires are required to properly assemble an integrated circuit. The embodiment of FIG. 2, discussed subsequently, illustrates this point.

Figure 2:
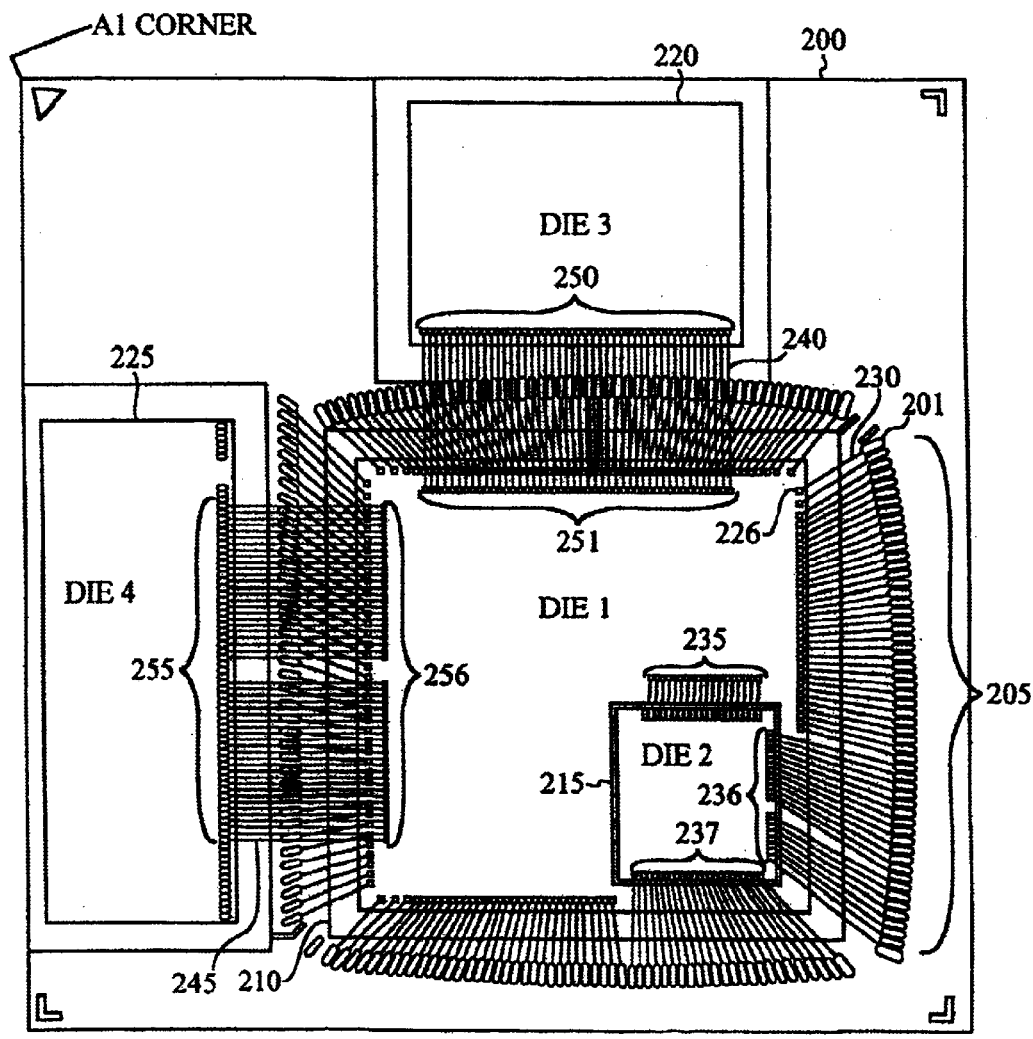
FIG. 2 shows a diagram of substrate bond fingers in accordance with the die-stacking method and apparatus of the present invention.

FIG. 2 illustrates an embodiment of a substrate (200) with bond fingers (201) that can be employed in an integrated circuit apparatus using the die-stacking method of the present invention. In this embodiment, the substrate (200) is comprised of 224 bond fingers (201) that are used to couple the dies (210, 220, and 225) that are on top of the substrate (200) with traces and vias.

In the interest of clarity, the traces and vias are not shown in FIG. 2. As is well known in the art, the traces couple the bond fingers to vias that, in turn, are coupled to pads on the underside of the substrate.

While a typical prior art substrate has all of its bond fingers located towards the center of the package, the present invention locates the bond fingers in different areas of the substrate, depending on the die layout. For example, in the embodiment illustrated in FIG. 2, the bond fingers are located in a corner (205) of the substrate (200). This layout permits the three lower dies (210, 220, and 225) to fit on the substrate. The fourth die (215) is stacked on the larger die (210) as will be discussed subsequently.

Referring to FIG. 2, lower die 1 (210) is comprised of a first row of pads (226) around its periphery that are coupled to the bond fingers (201) using bond wires (230). The stacked die (215) is mechanically coupled to die 1 (210). The stacked die (215) is also electrically coupled to die 1 (210) through bond wires (235) that connect pads on the stacked die (215) with inner pads on the lower die (210). Additional groups of pads (236, 237) on the stacked die (215) are coupled to the bond fingers on the substrate (200) with bond wires.

The remaining lower dies (220 and 225) are coupled to die 1 (210) with bond wire bridges (240 and 245). Die 3 (220) is comprised of pads (250) that are grouped on one side of the die (220). These pads are bridged with bond wires (240) to the corresponding group of pads (251) on die 1 (210).

Similarly, die 4 (225) is comprised of pads (255) that are grouped on one side that is closest to die 1 (210). These pads are bridged with bond wires (245) to the corresponding group of pads (256) on die 1 (210) that form a second row of pads adjacent to the first row.

The placement of the bond fingers and dies illustrated in FIG. 2 are for illustration purposes only. Other embodiments that have different circuit functions will require different quantities of bond fingers, different die quantities and size, and a different die layout. As an example, another embodiment may have more than one stacked die, as is illustrated in FIG. 3.

Figure 3:
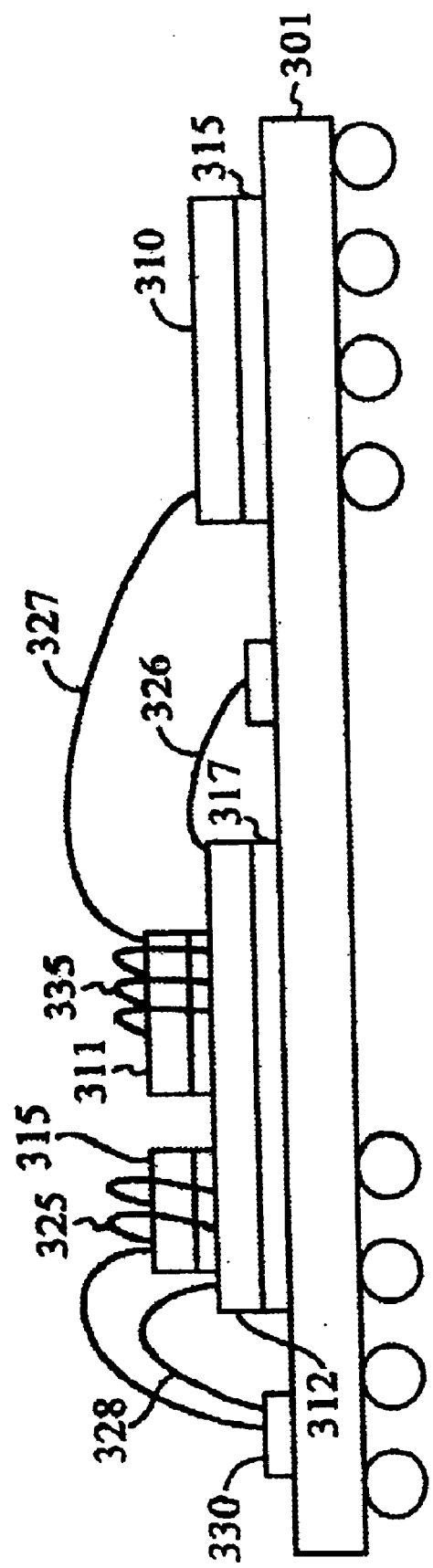
FIG. 3 shows a cut-away side view of another embodiment of an integrated circuit apparatus employing the die-stacking method of the present invention.

FIG. 3 illustrates a cut-away side view of another embodiment of the integrated circuit apparatus of the present invention. This apparatus is similar to the embodiment of FIG. 1 except that the stacked die of FIG. 1 may be divided into separate dies, depending on the functions of each die.

For example, in the preferred embodiment the stacked die of FIG. 1 has the function of both an analog circuit and memory. If these functions were designed as separate technologies (e.g., 0.25 $\mu$m and 0.18 $\mu$m), the dies may be fabricated separately, as illustrated in FIG. 3, and attached to a lower die.

Referring to FIG. 3, the lower die (312) is coupled to the substrate (301) with a layer of die attach epoxy (317). The upper dies (311 and 315) are coupled to the lower die (312) using a substantially similar epoxy. A separate die (310) may be attached to the substrate (301) with another layer of epoxy (315).

Bond wires (325 and 335) are then used to couple the upper dies (315 and 311) to the lower die (312). Bond wires (326 and 328) are also used to couple the lower die (312) to the substrate (301). Some of the pads the upper die (315) may also be coupled to bond fingers (330) on the substrate (301) through a bond wire.

As in the previous embodiments, a bond wire bridge (327) may be used to span any lower bond wires (326). In this embodiment, one bond wire bridge (327) couples the circuit of an upper die (311) to the circuit of the furthest die (310) while spanning a lower bond wire (326).

The embodiments illustrated above show only one die as having a stacked die. Alternate embodiments position any number of stacked dies on any number of lower dies. The only limitation is the size of the integrated circuit package desired by the embodiment.

Figure 4:
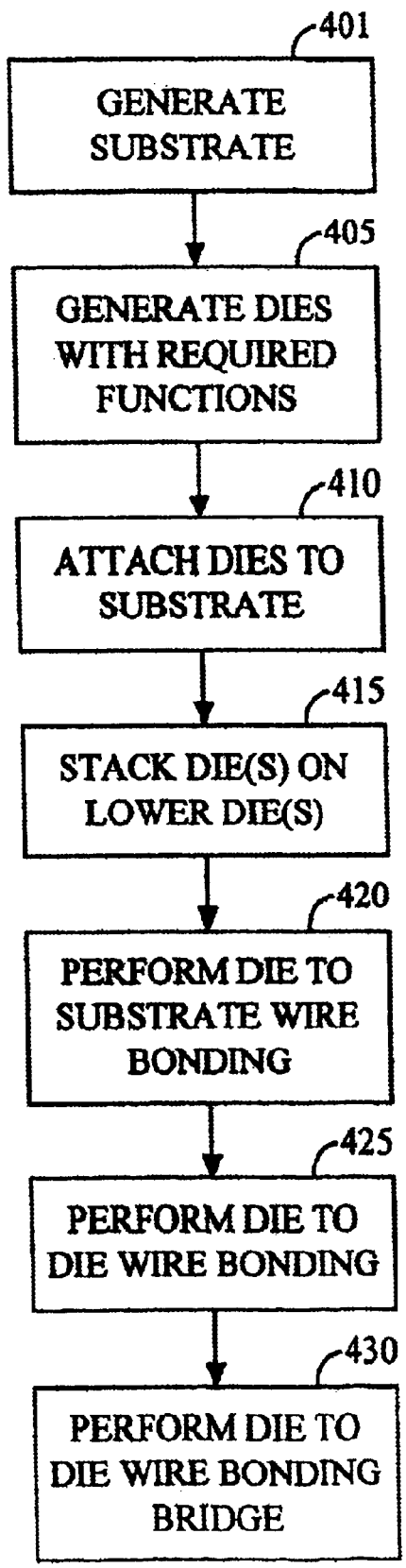
FIG. 4 shows a flowchart of the die-stacking method of the present invention.

FIG. 4 illustrates a flowchart of the die-stacking method of the present invention. The substrate is first generated (step 401) by designing the location of the traces, vias, and bonding fingers depending on the function of the integrated circuit to be constructed. The bonding fingers of the present invention are not required to be centralized on the substrate.

The dies are also designed and fabricated (step 405). The die design is completely dependent on the function to be performed by the integrated circuit package. In the preferred embodiment, a modem function is required so the dies would include a digital modem die, an analog circuit die, a RAM memory die, and a flash memory die.

As illustrated in the embodiment of FIG. 2, some dies are fabricated with their pads grouped along one side. This simplifies the wire bonding process. The choice of which dies have their pads grouped along one side is dependant on the die's location on the substrate.

The dies are then attached to the substrate (step 410). In this step, the dies are coupled mechanically to the substrate using the die attach epoxy as stated previously. Alternate embodiments may use other methods to mechanically connect the dies to the substrate.

The dies to be stacked are then mechanically coupled to the lower dies (step 415) in a substantially similar manner as the lower dies are attached to the substrate. This step may include coupling one die on top of one die, multiple dies on top of one die, or multiple dies on top of multiple dies.

The lower dies are then electrically coupled to the substrate (step 420) using a die-to-substrate wire bonding process. This process includes using a wire-bonding device to attach a bond wire between a pad on the die and a bond finger on the substrate.

If necessary, a die-to-die wire bonding process is performed (step 425). This process includes the wire-bonding device attaching a bond wire between a pad on the stacked die and a pad on the lower die to which the stacked die is mechanically coupled. This is performed for each stacked die requiring an electrical connection with the lower die.

A die-to-die bond wire bridge process can then be performed (step 430). This step provides an electrical connection between dies that are separated on the substrate. The bridge process includes the wire-bonding device attaching a bond wire between a die on one side of the substrate to a die on another side of the substrate. The bond wire spans any lower bond wires previously installed in the die-to-substrate process or the die-to-die process. The bridge bond wires may connect two dies that are coupled to the substrate. The bridge bond wires can also connect two dies in which one die is coupled to the substrate and the second die is stacked on a die. As a third embodiment, the bridge bond wires may connect two stacked dies.

Figure 5:
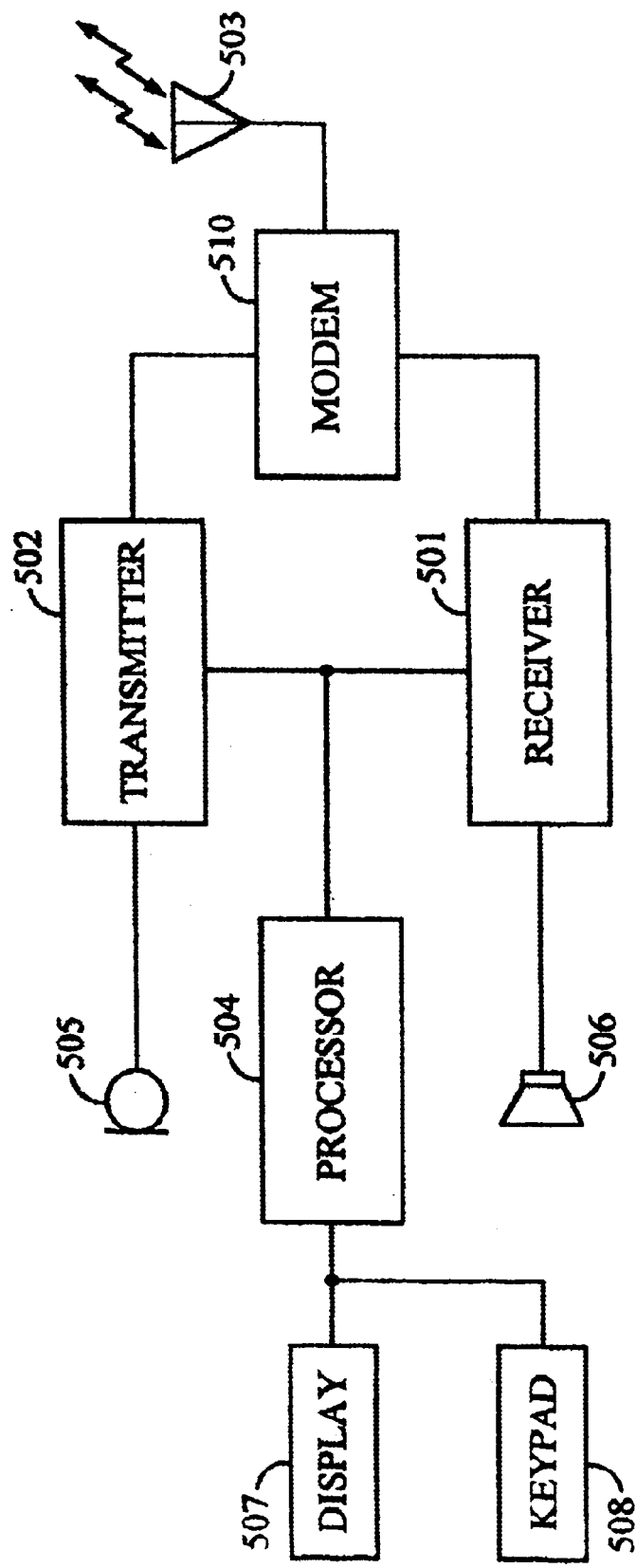
FIG. 5 shows a block diagram of a mobile station incorporating the die-stacking method of the present invention.

FIG. 5 illustrates a block diagram of a mobile station that incorporates the integrated circuit apparatus of the present invention. The mobile station is comprised of a transmitter (502) and receiver (501) that are coupled to a mobile station modem (510). The modem (510) is then coupled to an antenna (503).

The transmitter takes the aural signals from the microphone (505) and processes them for the modem. In some cases, depending on the type of mobile station, the transmitter (502) may digitize the aural signal from the microphone (505) prior to modulation by the modem (510). The modem (510) converts the digital signals of the mobile station into analog signals for transmission by the antenna (503)

The modem (510) also converts received analog signals into digital signals to be used by the mobile station's receiver (501). The receiver (501) then processes the data for use by the mobile station. Such a use includes transmission of the signals by the speaker (506) as aural signals.

The mobile station is controlled by a processor (504) such as a microprocessor or other controlling device. The processor is coupled to and controls the transmitter (502) and receiver (501) functions.

A display (507) and keypad (508) are coupled to the processor (504) for displaying information entered by a user on the keypad (508). For example, the user may enter a telephone number using the keypad (508) that is displayed on the display (507) and subsequently transmitted to a base station using the transmitter (502).

In the preferred embodiment, the integrated circuit apparatus of the present invention is the mobile station modem. Alternate embodiments of the integrated circuit apparatus include any electronic product that requires an integrated circuit package having multiple functions.

Figure 6:
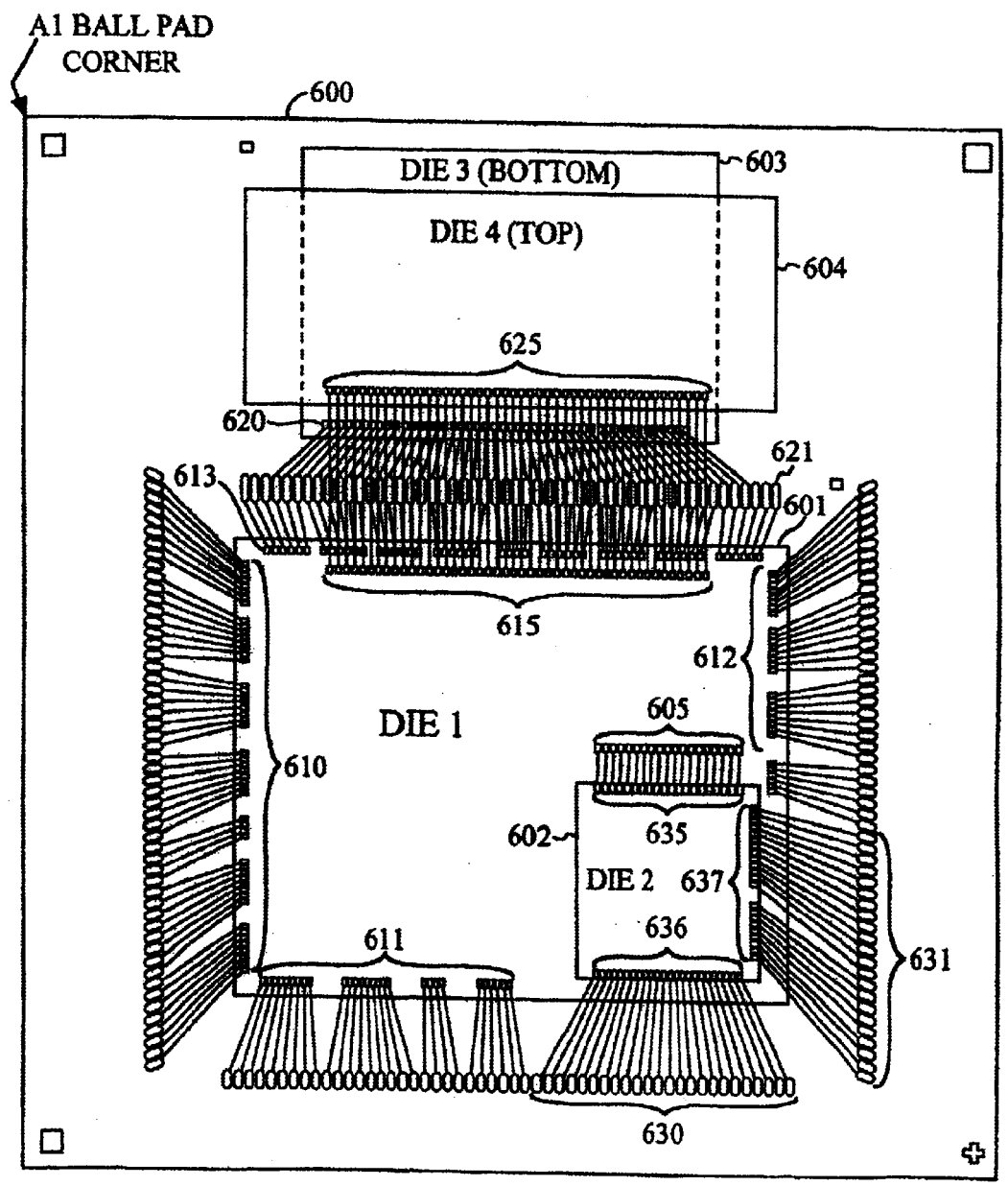
FIG. 6 shows yet another embodiment of an integrated circuit apparatus employing the die stacking method of the present invention.

FIG. 6 illustrates another embodiment of an IC-package using the die stacking method of the present invention. This IC-package is comprised of a substrate (600) that has the bond fingers for the main lower die (601) offset from the center of the substrate (600). However, in this embodiment, the bond fingers are grouped along the centerline of the substrate (600) but more towards one edge of the substrate. Die 1 (601) is coupled to the substrate in the center of this bond finger grouping.

A second lower die (603) is positioned on the substrate (600) laterally from die 1 (601) and parallel to both one edge of die 1 (601) and an edge of the substrate (600). In this embodiment, there are no bond fingers surrounding die 3 (603). In alternate embodiments, however, die 3 (603) is also surrounded by bond fingers.

Die 2 (602) is mechanically coupled to the top of die 1 (601). In this embodiment, die 2 (602) is coupled to a corner of die 1 (601). Alternate embodiments couple die 2 to other locations on die 1 (601).

Die 4 (604) is mechanically coupled to the top of die 3 (603). In this embodiment, die 4 is longer and narrower than die 3 (603). Alternate embodiments use other sizes and shape for this die.

As in previous embodiments, die 1 (601) is comprised of a periphery row of bond pads (610–613) that are coupled to the surrounding substrate bond fingers with lower bond wires. Die 1 also has an inner grouping of bond pads (605) that are coupled to die 2 (602) with bond wires.

Die 1 (601) additionally has a second row of periphery bond pads (615) that are grouped along one side of the die that is closest to dies 3 and 4 (603 and 604). This second row of periphery bond pads (615) are substantially adjacent to the outer row of periphery pads (613) on that side of the die.

Die 2 (602) is comprised of periphery bond pads (635–637) along three sides of the die. One side of bond pads (635) is coupled to the inner bond pads (605) of the lower die 1 (601). The other two sides of bond pads (636 and 637) are coupled to a subset portion of the bond fingers (630 and 631) on the substrate.

Die 3 (603) is comprised of a row of bond pads (620) that are grouped along one side of the die that is closest to die 1 (601). These bond pads are coupled to one row of bond fingers (621) on the substrate between die 1 (601) and dies 3 and 4 (603 and 604).

Die 4 (604) is comprised of a row of bond pads (625) that are grouped along one side of the die that is closest to die 1

(601). Die 4 (604) is coupled to die 1 (601) through these bond pads by bridge bond wires that coupled the bond fingers (625) of die 3 to the second row of periphery bond pads (615) of die 1 (601). These bridge bond wires span the lower bond wires that couple die 1 (601) and die 3 (603) to the substrate's bond fingers (621).

While the preferred embodiment uses dies to perform the functions of mobile station modem, memory, and analog circuits, alternate embodiments can stack dies of any functionality. Digital-to-analog converters, analog-to-digital converters, and radio frequency receivers are only a few examples of dies that can be stacked.

In summary, an integrated circuit apparatus comprising multiple die technologies may be constructed by stacking multiple smaller dies on top of another die that is coupled to a substrate. The dies can then be electrically coupled to each other and/or to the substrate through a wire bonding process. The upper dies are coupled to the lower dies through a die-to-die wire bonding process. Multiple lower dies may be connected to each other through a wire bond bridge process that spans the lower wire bonds.

What is claimed is:

1. An integrated circuit apparatus comprising:
   a substrate including a plurality of bond fingers that are located in an area surrounding a die area offset from a center of the substrate;
   a first lower die coupled to the substrate in the die area and having a plurality of pads on its periphery that are electrically coupled to the bond fingers with lower bond wires, the first lower die further including a second row of periphery pads on at least one side;
   a second lower die coupled to the substrate laterally from the first lower die, the second lower die including pads grouped along a first side closest to the first lower die;
   bridge bond wires coupling the pads of the second lower die to the second row of periphery pads such that the bridge bond wires span the lower bond wires; and
   a stacked die electrically coupled, with bond wires, directly to the first lower die and a subset of the plurality of bond fingers.

2. An integrated circuit apparatus comprising:
   a substrate including a plurality of bond fingers located in an area surrounding a die area offset from a center of the substrate;
   a first lower die coupled to the substrate in the die area, the first lower die having a plurality of first row periphery pads coupled to the plurality of bond fingers with lower bond wires, the first lower die further including a plurality of second row pads grouped along at least a first side;
   a second lower die coupled to the substrate along the first side of the first lower die, the second lower die including a plurality of pads grouped along a first side, the plurality of pads coupled to the plurality of second row pads of the first lower die using bridge bond wires that span the lower bond wires; and
   a stacked die mechanically coupled to the first lower die, the stacked die comprising a first group of pads directly coupled to inner pads of the first lower die, the stacked die further including a second group of pads electrically coupled to a subset of the plurality of bond fingers with bond wires.

3. The apparatus of claim 2, further including a third lower die coupled to the substrate laterally from the first lower die and along a second side of the first lower die, the third lower die including a plurality of pads grouped along a first side coupled to a plurality of second row pads grouped along the second side of the first lower die, the third lower die and the first lower die coupled with bridge bond wires spanning the lower bond wires.

4. The apparatus of claim 2, wherein the first upper die is coupled to the second lower die with bridge bond wires spanning the lower bond wires.

5. The apparatus of claim 2, wherein the first lower die includes mobile station modem functions, the second lower die includes flash memory functions, and the stacked die includes analog and memory functions.

6. In a mobile station comprising a plurality of integrated circuits, an integrated circuit apparatus comprising:
   a substrate including a plurality of bond fingers located in an area surrounding a die area that is offset from a center of the substrate;
   a first lower die coupled to the substrate in the die area and having a plurality of pads on its periphery electrically coupled to the bond fingers with lower bond wires, the first lower die further including a second row of periphery pads on at least one side;
   a second lower die coupled to the substrate laterally from the first lower die, the second lower die including pads grouped along a first side closest to the first lower die;
   bridge bond wires coupling the pads of the second lower die to the second row of periphery pads such that the bridge bond wires span the lower bond wires; and
   a stacked die electrically coupled, with bond wires, directly to the first lower die and a subset of the plurality of bond fingers.

7. An integrated circuit apparatus comprising:
   a substrate including a plurality of bond fingers grouped in an offset location of the substrate, the offset location being offset relative to a center of the substrate but along a centerline of the substrate;
   a first lower die coupled to the substrate in the offset location, the first lower die having a plurality of first row periphery pads, a plurality of inner pads, and a plurality of second row periphery pads along at least one side of the first lower die;
   a second lower die coupled to the substrate in a position between one edge of the substrate and one edge of the first lower die, the second lower die including a plurality of bond pads grouped along one edge of the second lower die closest to the first lower die;
   the first lower die coupled to the plurality of bond fingers with lower bond wires;
   the second lower die coupled to a first subset of bond fingers of the plurality of bond fingers;
   a first stacked die coupled to the first lower die, the first stacked die having a plurality of periphery pads, a first subset of which is coupled to the inner pads with bond wires, a second subset of the first stacked die periphery pads being coupled to a subset of the plurality of bond fingers;
   a second stacked die coupled to the second lower die, the second stacked die including a plurality of bond pads grouped along one edge of the second stacked die; and
   the second stacked die coupled to the first lower die with bridge bond wires that span the lower bond wires and couple the plurality of second stacked die bond pads to the plurality of second row periphery pads.

* * * * *

UNITED STATES PATENT AND TRADEMARK OFFICE
CERTIFICATE OF CORRECTION

PATENT NO.    : 6,787,901 B2
DATED         : September 7, 2004
INVENTOR(S)   : Edward Reyes and Fifin Irzhann It is certified that error appears in the above-identified patent and that said Letters Patent is hereby corrected as shown below:

Title page,
Item [54], Title, please replace with the following:
-- METHOD AND APPARATUS FOR DIE STACKING --

Signed and Sealed this

Twelfth Day of July, 2005

JON W. DUDAS
*Director of the United States Patent and Trademark Office*